United States Patent [19]

Moreau et al.

[11] 3,753,154

[45] Aug. 14, 1973

[54] CRYSTAL-CONTROLLED OSCILLATORS

[75] Inventors: Jean Pierre A. Moreau; Georges Schuler, both of Paris, France

[73] Assignee: Ses cosem-Societe Europeene de Semiconduteurs et de Micro-electronique, Paris, France

[22] Filed: Feb. 2, 1972

[21] Appl. No.: 222,778

[30] Foreign Application Priority Data

Feb. 17, 1971 France .............................. 7105365

[52] U.S. Cl. .............................. 331/116 R, 331/159

[51] Int. Cl. .............................................. H03b 5/36

[58] Field of Search .......................... 331/116 R, 159

[56] References Cited

UNITED STATES PATENTS

| | | | |
|---|---|---|---|
| 3,568,091 | 3/1971 | Rahe | 331/116 R |
| 3,585,527 | 6/1971 | Luscher | 331/116 R |

*Primary Examiner*—John Kominski
*Attorney*—John W. Malley, G. Lloyd Knight et al.

[57] ABSTRACT

A crystal-controlled oscillator of integrated circuit design, comprising, on the one hand, two MOS devices of opposite type, the first one being the load element associated with the second one, between gate and drain of which is connected a crystal wafer, and, on the other hand, a starter device constituted by two other MOS devices, of the same type as the second MOS device, their gates being respectively connected to the drain and to the gate of the second MOS device.

6 Claims, 2 Drawing Figures

CRYSTAL-CONTROLLED OSCILLATORS

BACKGROUND OF THE INVENTION

The present invention relates to crystal-controlled oscillators intended in particular for inclusion into integrated circuits, and relating more especially to the field of electronic clocks.

An oscillator of this kind comprises an oscillator element in the form of a crystal wafer, associated with an electronic circuit designed to compensate for the losses and thus to maintain the oscillations.

The application of this kind of system to timekeeping imposes number of conditions upon the design of the electronic circuit, viz:

a very small size and therefore integrated circuit design;

a low cost price, involving particularly simple circuitry and technology;

a very low power consumption;

a very low voltage supply.

The need on the one hand for integrated circuit design and on the other hand for low power consumption, in particular, leads to the use of a kind of field-effect transistor known in the art as a metal-oxide-semiconductor which, throughout the following description, will be indicated by the initials MOS; these are in fact high-impedance elements, so that their power consumption is much lower than that of conventional transistors.

Known embodiments of crystal-controlled oscillators chiefly comprise an amplifier across the terminals of which the crystal wafer is connected, and a load element which is connected to the amplifier output. The operation of this kind of device as an oscillator gives rise in particular, and at least during the start-up phase, to precise phase conditions for the signals at the oscillation frequency, making it necessary to operate it in the linear zone of the active component characteristics. In other words, in the case of an amplifier designed with MOS elements, for the reasons set out hereinbefore, it must be operated within an extremely restricted voltage range which is limited on the one hand by the maximum permissible supply voltage and on the other hand by the existence of a conduction threshold, below which there is no gain, and in the heighbourhood of which the element is highly non-linear.

The result, especially where application involves circuits supplied by batteries, these latter being elements whose output voltage decreases progressively during their operation, is that the time of utilisation of these batteries is reduced to that period of their operation in which the voltage supply is sufficient to produce linear working, this voltage value being in the order of 2 to 3 times the conduction threshold.

One type of amplifier operation which lends itself to a large voltage range is the non-linear type known as class C, in which are achieved current pulses which enable the oscillations to be maintened in continuous operation.

However, this type of operation does not, during the transitory start-up phase, permit the development of the oscillations in phase for which linear operation is essential.

The present invention relates to a crystal-controlled oscillator which enables this difficulty to be overcome by carrying out start-up of the device during a temporarily linear period of operation, achieved by an auxiliary starting device, and by insuring that the oscillations are kept in a non-linear operation range.

SUMMARY OF THE INVENTION

According to the invention, there is provided a crystal-controlled oscillator supplied by a voltage source, having two terminals and comprising: a first field-effect transitor of MOS type, . . . having three terminals: source, drain and gate, and a channel of a first conductive type, operating in a self-sustaining oscillatory condition; a crystal wafer determining the frequency of the oscillations of said oscillator, and provided with two electrodes respectively connected to said gate and drain of said first MOS device; a load element associated with said first MOS device, having two terminals, the first terminal being connected to said first MOS device drain and the second terminal being connected to the first terminal of said voltage source, the second terminal of said voltage source supplying a reference potential; and starting means for starting the self-oscillation condition, connected to said electrodes, incorporating at least two field-effect transistors of the MOS type to ensure the application, on said first MOS device gate, of a conduction voltage at least equal to the linearality threshold voltage of said first MOS device.

For a better understanding of the invention, reference will be made to the drawing, accompanying the following description and illustrating an embodiment of the crystal-controlled oscillator in accordance with the invention.

Figures 1, 2:
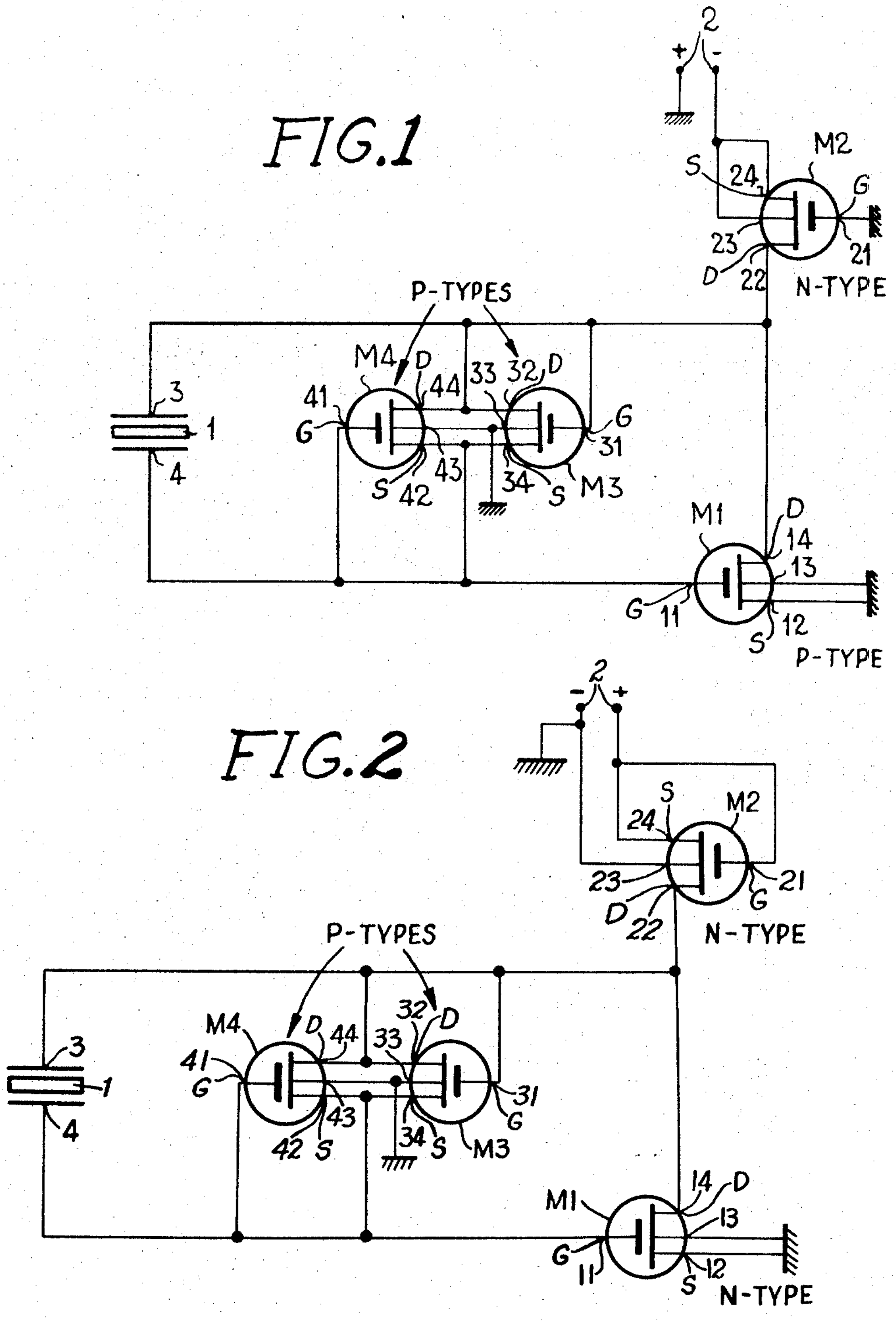
FIGS. 1 and 2 are schematic drawings illustrating the preferred embodiments of the present invention.

This oscillator comprises: a piezoelectric crystal 1, with its electrodes, made of quartz for example, which will be all throughout called cryatal wafer: a first MOS device, M1, whose channel is for example of P-type. MOS device, M1, whose channel is for example of P-type material, whose substrate 13 and source 12 are connected to a reference potential, or "earth", and whose gate 11 and drain 14 are respectively connected to the electrodes 4 and 3 of the crystal wafer 1; and a second MOS device, M2, whose channel is of the opposite type to that of the MOS device M1, that is to say an N-type channel in this case, whose gate 21 is earthed, whose drain 22 is coupled to the drain 14 of the MOS device M1, and whose substrate 23 and source 24 are coupled to the negative terminal of a voltage source 2, the positive terminal of which supplying the reference potential or "earth potential".

The oscillator comprises moreover a set of two MOS devices, M3 and M4, whose channels are of the same type as that of the MOS device M1, whose substrates 33 and 43 are earthed, and whose gates 31 and 41 are coupled respectively to the drain 14 and the gate 11 of the MOS device M1, the drain 32 and source 34 of the MOS device M3 being respectively connected to the drain 44 and the source 42 of the MOS device M4.

This device in operation comprises two stages, as explained hereinbefore: the start-up time and the oscillation keeping time.

During the start-up time, the source 24 of the MOS device M2 is supplied by the voltage source 2.

Depending upon whether a capacitance, known as the gate capacitance, defined by gate and substrate, of the MOS device M1 is initially charged or not, start-up can be achieved by two different mechanisms. It is there reminded that a P-type MOS device is electrically conductive when its gate is biased by a sufficiently negative potential in order to enable electric charges to pass between source and drain.

The first possible mechanism corresponds to the case in which said gate capacitance is initially charged, that is to say in this example the gate 11 is biased at a negative potential in relation to the substrate 13 which is maintained at the reference potential. The MOS device M1 is then electrically conductive and the potentials on the electrode 3, the drain 44 and the gate 31, are thus coupled to earth potential. Under these circumstances, the gate capacitance of the MOS device M3 not being sufficiently charged, will render the latter in a blocked condition, that is to say a non-conductive, whilst the MOS device M4 is conducting, its gate 41 being maintained at the same, negative in this case, potential as the gate 11 of the MOS device M1.

When a voltage is supplied the, above-mentioned bias voltage has the effect of bringing the potential of the source 42 of the MOS device M4, and thus that of the gate 11 of the MOS device M1, to a value V equal to the value U of the drain 22 voltage, less the voltage drop $V_H$ occuring across the device M4. For the oscillator to start under the conditions outlined hereinbefore, it is necessary for the value V, of the voltage thus supplied to the gate 11 of the MOS device M1, to be slightly higher than the linearality threshold of this element. This condition determines the value of the supply voltage, which is close to the voltage U, the MOS device M4 likewise operating at slightly higher voltages than its own linearality threshold, inducing a voltage drop to a, value $V_H$ which is, in practice, close to linearality threshold value, and having approximately the same characteristics as the MOS dvices M1 and M3. The voltage U should thus be, in practice, a little more than double the linearality threshold voltage of the MOS devices $M_1$, M3 or M4. Under these circumstances, the MOS device M1 will oscillate.

The second possible starting mechanism corresponds to the case in which the gate capacitance of the MOS device M1 is initially discharged, the device M1 being then in the blocked condition as well as the MOS device M4, whose gate 41 is at the same potential as the gate 11 of the device M1. When the voltage is supplied, the potentials on the electrode 3, the drain 32 and the gate 31 are closed to the voltage U. The gate capacitance of the MOS device M3 thus being charged, the latter is electrically conductive and, in similar manner to the aforedescribed one, the device M3 here replacing the device M4, the gate potential of the MOS device M1 has a value slightly higher than the linearality threshold.

When the gate 11 carries a potential slightly higher than the linearality threshold, the oscillator thus temporarily operates in a linear manner and oscillation commences at frequency which, as those skilled in the art will appreciate, is between the resonance frequency of the series circuit and the resonance frequency of the parallel circuit of the electrical network is equivalent to a crystal wafer.

In the second stage, when the oscillations have started, the MOS devices M3 and M4 have no active part to play, but a passive one, which enables the value of the voltage on the gate 11 to be maintained under the foregoing conditions. In other words, the oscillations at the electrode 3 cannot exceed the limits of the interval defined by the value of the reference potential and the supply voltage. The mean potential electrode 4, and on the gate 11, is limited by the trimming effect produced by the system comprising the MOS devices M3 and M4, which system is equivalent to a diode connected between the drain 22 of the MOS device M2 and the gate 11 of the MOS device M1.

The presence of the MOS devices M3 and M4 has the further advantage of acting as a protective diode, which is usually necessary to place at the gate of a MOS device because of the vulnerability of this latter to static charges. In fact, it is well known that because the gate has a high impedance, an accumulation of charges between the gate and substrate takes place very rapidly with the consequent risk of destructive perforation of the layer insulating the MOS device grid.

During this second phase, once the oscillations have been started, it is not longer essential for the operating condition to be a linear one and the maintenance of the crystal wafer vibrations can be limited to current pulses which are in accordance with the inherent characteristics of an amplifier class C operation, thus, as has been demostrated hereinbefore, making it possible to achieve a major reduction in the supply voltage which is required, with the attendant substantial advantages where the supply is by battery, this being the case in particular where applications in time-keeping are involved.

It is possible to replace the MOS devices M3 and M4, which constitute the auxiliary starter device, by two diodes D1 and D2, every one being connected in parallel across the terminals of the crystal wafer in the head-to-tail arrangement. However, the linear zone of operation of a diode is very narrow and this introduces additional limitations; the performance of this kind of diode starter device can still be improved by the addition of two sets of diodes each constituted by diodes connected in series with the diodes, D1 and D2 and conducting the current in the same direction thereas, the resultant performance nevertheless being inferior to that obtained by the use of two MOS devices M3 and M4.

On the other hand, if one refers to FIG. 2 showing another embodiment of the present invention, wherein similar reference numerals refer to similar elements of FIG. 1, it can be realized that at higher voltages, it is possible to use indiscrimately for the MOS device M2, a device with an N-type of a P-type channel, in the latter case its gate 21 being connected to the negative supply terminal and its substrate to the reference potential.

By way of example, the device in accordance with the invention including an MOS device M2 with an N-type channel may exhibit the following characteristics: a conduction threshold of 1 to 2 volts; a resistance equivalent, under these conditions, to between 1 and 4 megohms, the three MOS devices M1, M3 and M4 with P-type channels may exhibit following characteristics: a conduction threshold of −0.8 to −1 volt, and a channel geometry in the order of 30; operating at a supply voltage in excess of 2 volts for starting. The oscillatory condition being maintained at any voltage in excess of 1 volt, this indeed together with a very low power consumption of less than 2 microwatts, results in a device being excellently suited to the application of this oscillator to time-keeping and more particularly to electronic watches.

The aforedescribed embodiment of the invention has been given by way of non-limitative example. Thus, for example, the MOS devices M1, M3 and M4 can be replaced by MOS devices with N-type channels and the MOS device M2 by one with a P-type channel, the supply terminals 2 being reversed of course.

What is claimed is:

1. A crystal-controlled oscillator supplied by a voltage source, having two terminals, and comprising: a first field effect transistor of MOS type, having three terminals: source, drain and gate, and a channel of a first conductive type, operating in a self sustaining oscillatory condition; a crystal wafer determining the frequency of the oscillations of said oscillator, and provided with two electrodes respectively connected to said gate and drain of said first MOS device; a load element associated with said MOS device, having two terminals, the first terminal being connected to said first MOS device drain, and the second terminal being connected to the first terminal of said voltage source, the second terminal of said voltage source constituting a reference potential terminal; and starting means for starting the self-oscillation condition, connected to said electrodes, said starting means being constituted by two starting MOS devices, each having three terminals, source, drain and gate, and a channel of said first conductive type, their sources being connected to the gate and their drains to the drain of said first MOS device, and their gates being respectively connected to the gate and the drain of said first MOS device, these two starting MOS devices, ensuring the application, on said first MOS device gate, of a conduction voltage at least equal to the linearality threshold voltage of said first MOS device.

2. A crystal-controlled oscillator as claimed in claim 1, in which said load element is constituted by a second field-effect transistor of MOS type having a source, a drain and a gate, said first terminal being constituted by said drain and second terminal by said source, said gate being biased by a fixed potential.

3. An oscillator as claimed in claim 2, wherein said second MOS device have a channel which conductive type is opposite to said first conductive type, and wherein said fixed potential is provided by said second terminal of said voltage source.

4. A crystal-controlled oscillator as claimed in claim 3 where in said second MOS device has a channel with conductive type is said first conductive type, and wherein said fixed potential is provided by said first terminal of said voltage source.

5. A crystal-controlled oscillator as claimed in claim 1, in which said first conductive type is P-type, said reference potential being supplied by the positive terminal of said voltage source.

6. A crystal-controlled oscillator as claimed in claim 1, in which said first conductive type is N-type, said reference potential being supplied by the negative terminal of said voltage source.

* * * * *